(12) United States Patent
Huang et al.

(10) Patent No.: US 9,344,143 B2
(45) Date of Patent: May 17, 2016

(54) SIGNAL TRANSMITTING DEVICE AND SIGNAL TRANSMITTING METHOD

(71) Applicant: MEDIATEK INC., Hsin-Chu (TW)

(72) Inventors: Yen-Lin Huang, Taipei (TW); Hsiang-Hui Chang, Miaoli County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/798,042

(22) Filed: Mar. 12, 2013

(65) Prior Publication Data

US 2014/0029694 A1 Jan. 30, 2014

Related U.S. Application Data

(60) Provisional application No. 61/674,955, filed on Jul. 24, 2012.

(51) Int. Cl.
| | |
|---|---|
| *H04L 25/49* | (2006.01) |
| *H04B 1/64* | (2006.01) |
| *H03F 1/32* | (2006.01) |
| *H03F 3/189* | (2006.01) |
| *H03F 3/24* | (2006.01) |
| *H04B 1/04* | (2006.01) |

(52) U.S. Cl.
CPC ............... *H04B 1/64* (2013.01); *H03F 1/3247* (2013.01); *H03F 3/189* (2013.01); *H03F 3/24* (2013.01); *H03F 2200/336* (2013.01); *H04B 2001/0425* (2013.01); *Y02B 60/50* (2013.01)

(58) Field of Classification Search
CPC ............ H04B 1/0475; H04B 2001/0425; H04B 2001/0433; H04L 27/368; H04L 25/03343; H04L 27/2626

USPC ............................................. 375/296
See application file for complete search history.

(56) References Cited

U.S. PATENT DOCUMENTS

| | | | |
|---|---|---|---|
| 6,298,096 B1 | 10/2001 | Burgin | |
| 8,045,642 B2 | 10/2011 | Rexberg | |
| 2005/0018787 A1* | 1/2005 | Saed | 375/296 |
| 2006/0240786 A1* | 10/2006 | Liu | 455/114.3 |

(Continued)

FOREIGN PATENT DOCUMENTS

| | | |
|---|---|---|
| CN | 101662821 A | 3/2010 |
| CN | 101674054 A | 3/2010 |

OTHER PUBLICATIONS

Asensio et al., Title: Predistortion Circuit, Wireless Communication Unit and Method for Coefficient Estimation, pending U.S. Appl. No. 13/612,872, filed Sep. 13, 2012.

*Primary Examiner* — David S Huang
(74) *Attorney, Agent, or Firm* — Winston Hsu; Scott Margo

(57) ABSTRACT

A signal transmitting device includes: a signal processing circuit arranged to process an input signal to generate a processed input signal according to a compensating signal; a signal converting circuit arranged to convert the processed input signal to generate an output signal according to an oscillating signal; and an arithmetic circuit arranged to generate the compensating signal according to the power of a predetermined component in the output signal, wherein the signal processing circuit uses the compensating signal to update the input signal, and the signal converting circuit converts the updated input signal to reduce the power of the predetermined component in the output signal.

19 Claims, 3 Drawing Sheets

(56) References Cited

U.S. PATENT DOCUMENTS

| | | | |
|---|---|---|---|
| 2007/0190952 A1* | 8/2007 | Waheed | H04B 1/0475 455/114.3 |
| 2009/0121788 A1* | 5/2009 | Deisch | 330/149 |
| 2009/0247095 A1 | 10/2009 | Pan | |
| 2009/0290631 A1* | 11/2009 | Lee et al. | 375/240 |
| 2010/0056082 A1* | 3/2010 | Chiu et al. | 455/114.3 |
| 2010/0060356 A1* | 3/2010 | Suzuki et al. | 330/149 |
| 2010/0164629 A1* | 7/2010 | Behzad et al. | 330/296 |
| 2010/0289572 A1* | 11/2010 | Li et al. | 330/149 |
| 2011/0280582 A1* | 11/2011 | Piehler | H04B 10/2507 398/117 |

\* cited by examiner

SIGNAL TRANSMITTING DEVICE AND SIGNAL TRANSMITTING METHOD

CROSS REFERENCE TO RELATED APPLICATIONS

This application claims the benefit of U.S. Provisional Application No. 61/674,955, which was filed on 2012 Jul. 24 and is included herein by reference.

BACKGROUND

The present invention relates to a signal transmitting device and a signal transmitting method, and more particularly to a compensator for reducing harmonic distortion tones of a signal transmitting device, and a method thereof.

In the field of wireless communication systems, a transmitter may consume most of the power of the front end circuit. A high efficiency transmitter is therefore required. In the high efficiency transmitter, a passive mixer is usually adopted since the passive mixer consumes less current and occupies a smaller silicon area than other mixers. The passive mixer will produce LO (Local Oscillator) harmonics terms at the input of the driver of the transmitter. These LO harmonic terms will be intermodulated with the desired signal, which produces distortion terms at the output of the driver. These distortion terms will degrade aspects of the transmitter performance such as EVM (Error Vector Magnitude), spectral emission, etc. The transmitter performance may also be degraded by the IF (Intermediate Frequency) nonlinearity effect, which causes the transmitter to produce distortion terms at the mixer input. Therefore, how to reduce the distortion terms generated by either IF nonlinearity or the intermodulation terms between LO harmonics and the desired signal of a transmitter is an urgent problem in this field.

SUMMARY

One objective of the present embodiment is to provide a signal transmitting device having a compensator to reduce harmonic distortion tones of the signal transmitting device, and a method thereof.

According to a first embodiment of the present invention, a signal transmitting device is provided. The signal transmitting device includes a signal processing circuit, a signal converting circuit, and an arithmetic circuit. The signal processing circuit is arranged to process an input signal to generate a processed input signal according to a compensating signal. The signal converting circuit is arranged to convert the processed input signal to generate an output signal according to an oscillating signal. The arithmetic circuit is arranged to generate the compensating signal according to the power of a predetermined component in the output signal, wherein the signal processing circuit uses the compensating signal to update the input signal, and the signal converting circuit converts the updated input signal to reduce the power of the predetermined component in the output signal.

According to a second embodiment of the present invention, a signal transmitting method is provided. The signal transmitting method includes: processing an input signal to generate a processed input signal according to a compensating signal; converting the processed input signal to generate an output signal according to an oscillating signal; generating the compensating signal according to the power of a predetermined component in the output signal; using the compensating signal to update the input signal; and converting the updated input signal to reduce the power of the predetermined component in the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
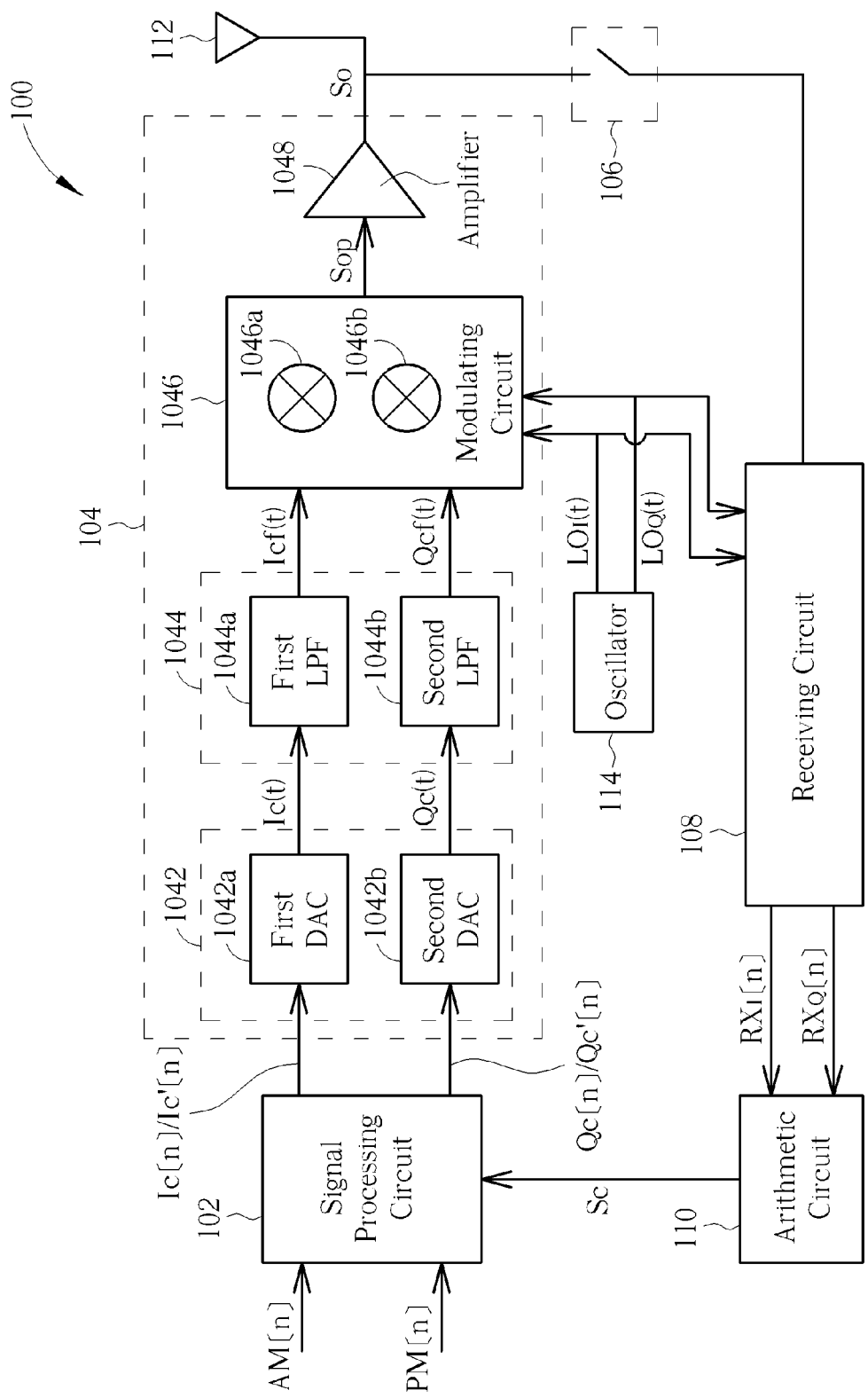
FIG. 1 is a diagram illustrating a signal transmitting device according to a first embodiment of the present invention.

Please refer to FIG. 1, which is a diagram illustrating a signal transmitting device 100 according to a first embodiment of the present invention. The signal transmitting device 100 comprises a signal processing circuit 102, a signal converting circuit 104, a switching circuit 106, a receiving circuit 108, an arithmetic circuit 110, an antenna 112, and an oscillator 114. The signal processing circuit 102 is arranged to process an input signal AM[n], PM[n] to generate a processed input signal Ic[n], Qc[n] according to a compensating signal Sc. The signal converting circuit 104 is arranged to convert the processed input signal Ic[n], Qc[n] to generate an output signal So according to an oscillating signal $LO_I(t)$, $LO_Q(t)$ generated by the oscillator 114. The switching circuit 106 is arranged to selectively couple the output signal So to a receiving circuit 108 under a calibration mode of the signal transmitting device 100. The receiving circuit 108 is arranged to receive the output signal So for generating a received signal $RX_I[n]$, $RX_Q[n]$ according to the oscillating signal $LO_I(t)$, $LO_Q(t)$. The arithmetic circuit 110 is arranged to generate the compensating signal Sc according to the power of a predetermined component in the output signal So; wherein the signal processing circuit 102 uses the compensating signal Sc to process the input signal AM[n], PM[n] to generate an updated input signal Ic'[n], Qc'[n], and the signal converting circuit 104 converts the updated input signal Ic'[n], Qc'[n] to reduce the power of the predetermined component in the output signal So. It is noted that the receiving circuit 108 may be the shared receiving circuit used for receiving the RF signal under the normal operation mode of this wireless communication system.

The signal converting circuit 104 comprises a digital-to-analog converting circuit 1042, a filtering circuit 1044, a modulating circuit 1046, and an amplifier 1048. The digitalto-analog converting circuit 1042 is coupled to the signal processing circuit 102 for converting the updated input signal Ic'[n], Qc'[n] to generate an analog input signal Ic, Qc. The filtering circuit 1044 is coupled to the digital-to-analog converting circuit 1042 for performing a low-passed filtering operation upon the analog input signal Ic(t), Qc(t) to generate a filtered input signal Icf(t), Qcf(t). The modulating circuit 1046 is coupled to the filtering circuit 1044 for modulating the filtered input signal Icf(t), Qcf(t) to generate a pre-transmitted output signal Sop according to the oscillating signal $LO_I(t)$, $LO_Q(t)$. The amplifier 1048 is coupled to the modulating circuit 1046 for amplifying the pre-transmitted output signal Sop to generate the output signal So.

It is noted that the updated input signal Ic'[n], Qc'[n] comprises an in-phase digital signal Ic'[n] and a quadrature digital signal Qc'[n] as shown in FIG. 1. Furthermore, the digital-to-analog converting circuit 1042 comprises a first digital-to-analog converter (DAC) 1042a and a second digital-to-analog converter 1042b. The first digital-to-analog converter 1042a is arranged to convert the in-phase digital signal Ic'[n] into an in-phase analog input signal Ic(t) of the analog input signal Ic(t), Qc(t). The second digital-to-analog converter 1042b is arranged to convert the quadrature digital signal Qc'[n] into a quadrature analog input signal Qc(t) of the analog input signal Ic(t), Qc(t). The filtering circuit 1044 comprises a first low-pass filter (LPF) 1044a and a second low-pass filter 1044b. The first low-pass filter 1044a is arranged to perform a first low-pass operation upon the in-phase analog input signal Ic(t) to generate the filtered in-phase analog signal Icf(t) of the filtered input signal Icf(t), Qcf(t). The second low-pass filter 1044b is arranged to perform a second low-pass operation upon the quadrature analog input signal Qc(t) to generate the filtered quadrature analog signal Qcf(t) of the filtered input signal Icf(t), Qcf(t). The modulating circuit 1046 comprises a first mixer 1046a and a second mixer 1046b. The first mixer 1046a is arranged to modulate the filtered in-phase analog signal Icf(t) to generate an in-phase pre-transmitted output signal according to an in-phase oscillating signal $LO_I(t)$ in the oscillating signal $LO_I(t)$, $LO_Q(t)$. The second mixer 1046b is arranged to modulate the filtered quadrature analog signal Qcf(t) to generate a quadrature pre-transmitted output signal according to a quadrature oscillating signal $LO_Q(t)$ in the oscillating signal $LO_I(t)$, $LO_Q(t)$; wherein the pre-transmitted output Sop is generated by combining the in-phase pre-transmitted output signal and the quadrature pre-transmitted output signal as shown in FIG. 1.

The signal processing circuit 102 may be a Polar-to-Cartesian signal converter, a Cartesian-to-Polar signal converter, a Polar-to-Polar signal converter, or a Cartesian-to-Cartesian signal converter. In this embodiment, the signal processing circuit 102 is a Polar-to-Cartesian signal converter. Therefore, the input signal AM[n], PM[n] is a Polar based signal comprising an amplitude component AM[n] and a phase component PM[n], and the processed input signal Ic[n], Qc[n] is a Cartesian based signal comprising an in-phase component Ic[n] and a quadrature component Qc[n] as well as the updated input signal Ic'[n], Qc'[n]. In addition, the signal processing circuit 102 is used as a digital pre-distortion compensator for pre-distorting the input signal AM[n], PM[n] to generate the updated input signal Ic'[n], Qc'[n] according to the compensating signal Sc.

When the signal transmitting device 100 is powered on and before the transmission of the real data signal, the signal transmitting device 100 enters a calibration mode to calibrate the signal converting circuit 104 in order to reduce the distortion terms generated by IF nonlinearity and/or the intermodulation terms between LO harmonics and the desired signal of the transmitting device 100. The switching circuit 106 couples the output signal So to the receiving circuit 108 when the signal transmitting device 100 enters the calibration mode. Then, the input signal AM[n], PM[n] with the two-tone baseband signal is inputted to the signal processing circuit 102. Here, the two-tone baseband signal can be regarded as a testing signal and not a real data signal. After the input signal AM[n], PM[n] is up-converted, the output signal So is generated, in which the output signal So may comprise the distortion terms generated by IF nonlinearity and/or the intermodulation terms of LO harmonics and the input signal AM[n], PM[n]. The output signal So may be expressed by the following first equation (1):

$$RFout(t) = A(t)\exp(j\theta(t)) + \alpha_3 A^3(t)\exp(j\theta(t)) + \alpha_5 A^5(t)\exp(j\theta(t)) +$$
$$\beta_{-3} A^3(t)\exp(-j3\theta(t)) + \beta_5 A^5(t)\exp(j5\theta(t)) + \ldots \text{ high order terms}$$

The term $A(t)\exp(j\theta(t))$ is the wanted output signal, the term $\alpha_3 A^3(t)\exp(j\theta(t))$ is the third order in-band harmonic distortion component, the term $\alpha_5 A^5(t)\exp(j\theta(t))$ is the fifth order in-band harmonic distortion component, the term $\beta_{-3} A^3(t)\exp(-j3\theta(t))$ is the third order out-band harmonic distortion component, and the term $\beta_5 A^5(t)\exp(j5\theta(t))$ is the fifth order out-band harmonic distortion component. The coefficients $\alpha_3$, $\alpha_5$, $\beta_{-3}$, and are $\beta_5$ are complex numbers. Moreover, it should be noted that the above-mentioned third/fifth order in/out-band harmonic distortion components may be generated by either IF nonlinearity or the intermodulation of LO harmonic and the wanted signal (e.g. the input signal AM[n], PM[n]). In addition, the first equation (1) is expressed as a complex baseband equivalent model, which means that the carrier term is omitted in the first equation (1). To compensate for the transmitter nonlinearity, the signal processing circuit 102 is arranged to pre-distort the input signal AM[n], PM[n] by using a similar complex coefficient (but out of phase) as the nonlinearity model of the output signal So as expressed by equation (1), and the pre-distorted input signal is expressed by the following second equation (2):

$$BBCOMP_{out}(t) = A(t)\exp(j\theta(t)) - \gamma_3 A^3(t)\exp(j\theta(t)) - \gamma_5 A^5(t)\exp(j\theta(t)) -$$
$$\lambda_{-3} A^3(t)\exp(-j3\theta(t)) - \lambda_5 A^5(t)\exp(j5\theta(t)) - \ldots \text{ high order terms}$$

The coefficients $\gamma_3$, $\gamma_5$, $\lambda_{-3}$, and $\lambda_5$ are complex numbers calculated by the arithmetic circuit 110. More specifically, when the output signal So is down-converted by the receiving circuit 108, the complex coefficients $\alpha_3$, $\alpha_5$, $\beta_{-3}$, and $\beta_5$ in equation (1) can be obtained by the arithmetic circuit 110. The arithmetic circuit 110 may use a searching algorithm to determine the complex coefficients $\gamma_3$, $\gamma_5$, $\lambda_{-3}$, and $\lambda_5$. Then, the signal processing circuit 102 uses the complex coefficients $\gamma_3$, $\gamma_5$, $\lambda_{-3}$, and $\lambda_5$ to generate the complex baseband signal $BBCOMP_{out}(t)$ as expressed in equation (2). In other words, the signal processing circuit 102 pre-distorts the input signal AM[n], PM[n] by adding the third/fifth order in/out-band harmonic distortion compensation components to generate the updated input signal Ic'[n], Qc'[n] (i.e. the complex baseband signal $BBCOMP_{out}(t)$) to the signal converting circuit 104. Accordingly, the powers of third/fifth order in/out-band harmonic distortion components in the output signal So can be reduced or cancelled after the signal converting circuit 104 up-converts and amplifies the updated input signal Ic'[n], Qc'[n]. It is noted that the above-mentioned compensating signal Sc may include the information of the complex coefficients $\gamma_3, \gamma_5, \lambda_{-3}$, and $\lambda_{-5}$. In addition, the switching circuit 106 disconnects the output signal So from the receiving circuit 108 when the signal transmitting device 100 finishes the calibration mode.

Figure 2:
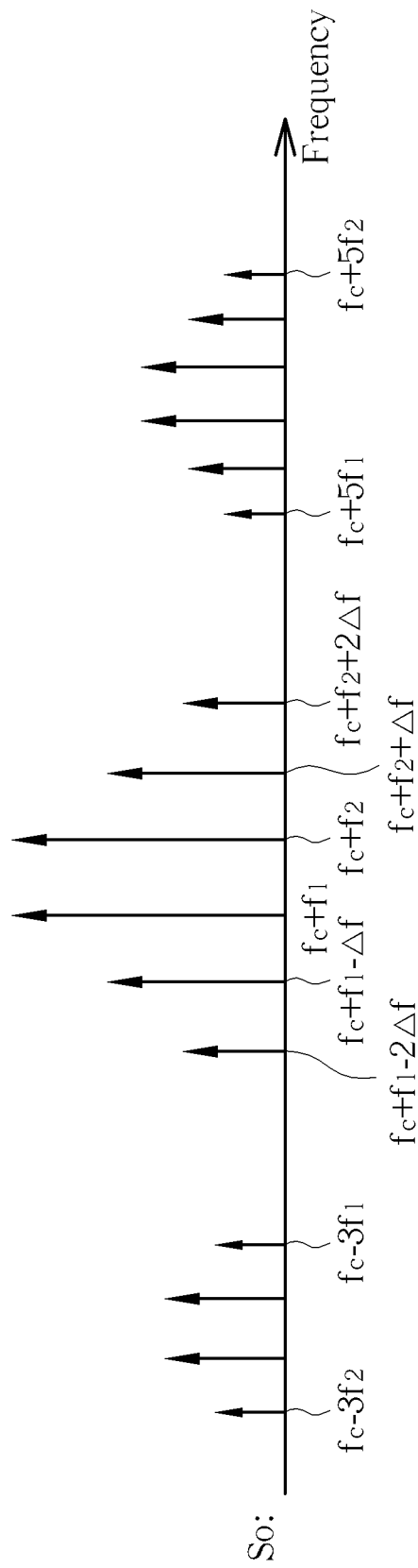
FIG. 2 is a diagram illustrating a frequency response of an output signal according to an embodiment of the present invention.

Please refer to FIG. 2, which is a diagram illustrating a frequency response of the output signal So according to an embodiment of the present invention. The output signal So is generated by inputting a two-tone baseband signal, i.e. the input signal AM[n], PM[n], to the signal processing circuit 102. The two tone frequencies of the input signal AM[n], PM[n] are $f_1$ and $f_2$ respectively, and the carrier frequency of the transmitting device 100, i.e. the oscillating frequency of the oscillating signal $LO_I(t)$, $LO_Q(t)$, is $f_c$. Therefore, the output signal So may comprise at least six signal tones in the in-band, in which the frequencies of the six signal tones are $f_c+f_1$, $f_c+f_2$, $f_c+f_1-\Delta f$, $f_c+f_2+\Delta f$, $f_c+f_1-2\Delta f$, $f_c+f_2+2\Delta f$, etc, wherein the signal tones $f_c+f_1$, $f_c+f_2$ are the desired signals, the signal tones $f_c+f_1-\Delta f$, $f_c+f_2+\Delta f$ are the in-band third order harmonic distortion tones, and the signal tones $f_c+f_1-2\Delta f$, $f_c+f_2+2\Delta f$ are the in-band fifth order harmonic distortion tones. The output signal So may also comprise at least six signal tones (i.e. the out-band fifth order harmonic distortion tones) in the higher out-band located between two signal tones of frequencies $f_c+5f_1$ and $f_c+5f_2$, and at least four signal tones (i.e. the out-band third order harmonic distortion tones) in the lower out-band located between two signal tones of frequencies $f_c-3f_2$ and $f_c-3f_1$ as shown in FIG. 2.

According to FIG. 2, the arithmetic circuit 110 may use a baseband tone correlating method to detect the power of the predetermined component corresponding to a predetermined frequency band in the output signal So, i.e. the powers of the third/fifth order in/out-band harmonic distortion tones. The arithmetic circuit 110 measures the power of a predetermined component by correlating a tone of the predetermined component with a predetermined tone signal. Then, if the powers of the third/fifth order in/out-band harmonic distortion tones of the output signal So are obtained by the arithmetic circuit 110, the signal processing circuit 102 adds the third/fifth order in/out-band harmonic distortion compensation components to the input signal AM[n], PM[n]. Please see equation (2), wherein the input signal AM[n], PM[n] is the term $A(t)\exp(j\theta(t))$, and the third/fifth order in/out-band harmonic distortion compensation components are the terms—$\gamma_3 A^3(t)\exp(j\theta(t))$–$\gamma_5 A^5(t)\exp(j\theta(t))$–$\lambda_{-3} A^3(t)\exp(-j3\theta(t))$–$\lambda_{-5} A^5(t)\exp(j5\theta(t))$. In addition, the arithmetic circuit 110 adjusts the complex coefficients $\gamma_3$, $\gamma_5$, $\lambda_{-3}$, and $\lambda_{-5}$ to minimize the powers of the third/fifth order in/out-band harmonic distortion tones in the output signal So. It should be noted that the signal transmitting device 100 may repeat the steps of inputting the two tones input signal AM[n], PM[n], detecting the powers of the third/fifth order in/out-band harmonic distortion tones of the output signal So, and adjusting the complex coefficients $\gamma_3$, $\gamma_5$, $\lambda_{-3}$, and $\lambda_{-5}$ until the powers of the third/fifth order in/out-band harmonic distortion tones in the output signal So are minimized. In other words, after the calibration mode of the signal transmitting device 100, the powers of the signal tones at the frequencies $f_c+f_1-\Delta f$, $f_c+f_2+\Delta f$, $f_c+f_1-2\Delta f$, $f_c+f_2+2\Delta f$, the powers of the signal tones between the frequencies $f_c-5f_1$ and $f_c+5f_2$, and the powers of the signal tones between the frequencies $f_c-3f_2$ and $f_c-3f_1$ are reduced or vanished.

It is noted that, by inputting the two tones input signal AM[n], PM[n] into the signal transmitting device 100, the signal converting circuit 104 will induce the third order in-band harmonic distortion component, the fifth order in-band harmonic distortion component, the third order out-band harmonic distortion component, and fifth order out-band harmonic distortion component in the output signal So as shown in FIG. 2. Then, the powers of the third order in-band harmonic distortion component, the fifth order in-band harmonic distortion component, the third order out-band harmonic distortion component, and fifth order out-band harmonic distortion component in the output signal So can be detected by the arithmetic circuit 110. It should be noted that the IF nonlinearity and/or the intermodulation terms between LO harmonics and the single tone input signal may not induce the multi-tone third/fifth order in/out-band harmonic distortion components in the output signal So. Therefore, if a single tone input signal is used as a test tone inputting to the signal transmitting device 100, the multi-tone third/fifth order in/out-band harmonic distortion components in the output signal So may become a single tone signal, and the arithmetic circuit 110 is unable to detect the power of the third/fifth order in/out-band harmonic distortion components in the output signal So differently. More specifically, if a single tone input signal is inputted as a testing signal for the signal transmitting device 100, the output signal So may comprise one tone of wanted component and two tones of out-band harmonic distortion components. Therefore, if a single tone input signal is inputted as a testing signal, the arithmetic circuit 110 may only detect the power of out-band harmonic distortion components in the output signal So.

Figure 3:
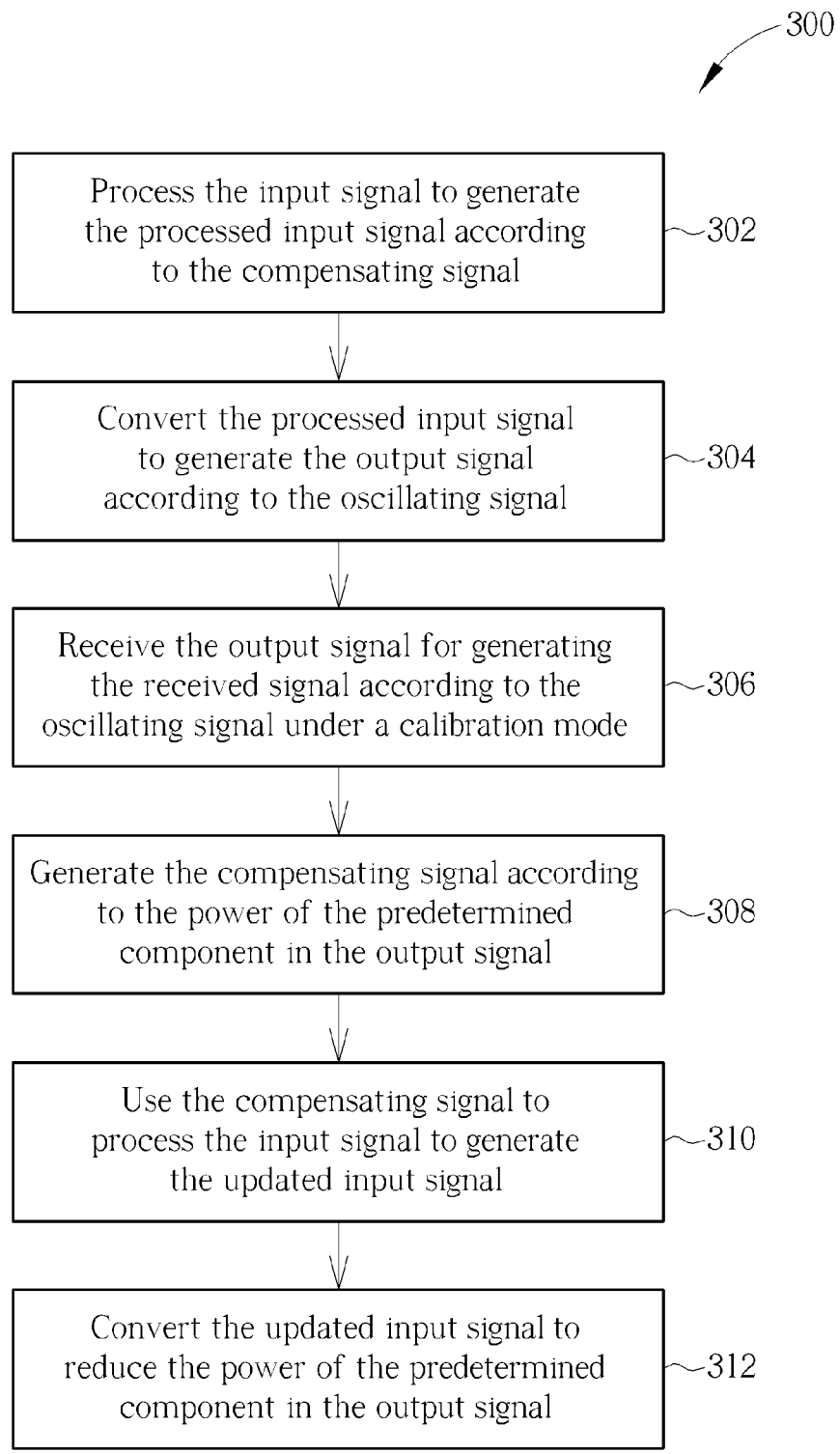
FIG. 3 is a flowchart illustrating a signal transmitting method according to an embodiment of the present invention.

According to the above description, the method employed by the transmitting device 100 to reduce the powers of third/fifth order in/out-band harmonic distortion components in the output signal So can be briefly illustrated by FIG. 3, which is a flowchart illustrating a signal transmitting method 300 according to an embodiment of the present invention. This diagram is not a limitation of the present signal transmitting method 300. Provided that substantially the same result is achieved, the steps of the flowchart shown in FIG. 3 need not be in the exact order shown and need not be contiguous; that is, other steps can be intermediate. The signal transmitting method 300 comprises the steps of:

Step 302: Process the input signal AM[n], PM[n] to generate the processed input signal Ic[n], Qc[n] according to the compensating signal Sc;

Step 304: Convert the processed input signal Ic[n], Qc[n] to generate the output signal So according to the oscillating signal $LO_I(t)$, $LO_Q(t)$;

Step 306: Receive the output signal So for generating the received signal $RX_Q[n]$, $RX_Q[n]$ according to the oscillating signal $LO_I(t)$, $LO_Q(t)$ under a calibration mode;

Step 308: Generate the compensating signal Sc according to the power of the predetermined component in the output signal So;

Step 310: Use the compensating signal Sc to process the input signal AM[n], PM[n] to generate the updated input signal Ic'[n], Qc'[n]; and Step 312: Convert the updated input signal Ic'[n], Qc'[n] to reduce the power of the predetermined component in the output signal So.

Briefly, the present embodiments (i.e. the transmitting device 100 and the transmitting method 300) provides a loop-back calibration scheme comprising the signal processing circuit 102, the signal converting circuit 104, the switching circuit 106, the receiving circuit 108, and the arithmetic circuit 110 for repeating the steps of inputting the two tones input signal AM[n], PM[n], detecting the powers of the third/fifth order in/out-band harmonic distortion tones of the output signal So, and adjusting the complex coefficients $\gamma_3$, $\gamma_5$, $\lambda_{-3}$, and $\lambda_{-5}$ to pre-distort the input signal AM[n], PM[n] until the powers of the third/fifth order in/out-band harmonic distortion tones in the output signal So are minimized. Therefore, the present invention provides a high efficient and low-cost way to mitigate the performance degradation caused by nonlinearity and harmonic distortion of RF transmitter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transmitting device, comprising:
   a signal processing circuit, arranged to process an input signal to generate a processed input signal according to a compensating signal;
   a signal converting circuit, arranged to convert the processed input signal to generate an output signal according to an oscillating signal; and
   an arithmetic circuit, arranged to generate the compensating signal according to a power of a predetermined component in the output signal, wherein the compensating signal comprises compensation components corresponding to the predetermined component in the output signal, and the predetermined component comprises a third order in-band component and a third order out-band component of the output signal, or the predetermined component comprises a fifth order in-band component and a fifth order out-band component of the output signal;
   wherein the signal processing circuit uses the compensating signal to add the compensation components to the input signal to update the input signal, and the signal converting circuit converts the updated input signal to reduce the power of the predetermined component in the output signal.

2. The signal transmitting device of claim 1, wherein the input signal is a two-tone baseband signal.

3. The signal transmitting device of claim 1, wherein the predetermined component corresponds to a predetermined frequency band in the output signal.

4. The signal transmitting device of claim 1, wherein the signal processing circuit comprises a digital pre-distortion compensator, and the digital pre-distortion compensator pre-distorts the input signal to generate the updated input signal according to the compensating signal.

5. The signal transmitting device of claim 1, wherein the signal converting circuit comprises:
   a digital-to-analog converting circuit, coupled to the signal processing circuit, for converting the updated input signal to generate an analog input signal;
   a filtering circuit, coupled to the digital-to-analog converting circuit, for performing a low-pass filtering operation upon the analog input signal to generate a filtered input signal;
   a modulating circuit, coupled to the filtering circuit, for modulating the filtered input signal to generate a pre-transmitted output signal according to the oscillating signal; and
   an amplifier, coupled to the modulating circuit, for amplifying the pre-transmitted output signal to generate the output signal.

6. The signal transmitting device of claim 5, wherein the updated input signal comprises an in-phase digital signal and a quadrature digital signal, and the digital-to-analog converting circuit comprises:
   a first digital-to-analog converter, arranged to convert the in-phase digital signal into an in-phase analog input signal of the analog input signal; and
   a second digital-to-analog converter, arranged to convert the quadrature digital signal into a quadrature analog input signal of the analog input signal;
   the filtering circuit comprises:
   a first low-pass filter, arranged to perform a first low-pass operation upon the in-phase analog input signal to generate a filtered in-phase analog signal; and
   a second low-pass filter, arranged to perform a second low-pass operation upon the quadrature analog input signal to generate a filtered quadrature analog signal; and
   the modulating circuit comprises:
   a first mixer, arranged to modulate the filtered in-phase analog signal to generate an in-phase pre-transmitted output signal according to the oscillating signal; and
   a second mixer, arranged to modulate the filtered quadrature analog signal to generate a quadrature pre-transmitted output signal according to the oscillating signal;
   wherein the pre-transmitted output is generated by combining the in-phase pre-transmitted output signal and the quadrature pre-transmitted output signal.

7. The signal transmitting device of claim 1, further comprising:
   a receiving circuit, arranged to receive the output signal for generating a received signal according to the oscillating signal; and
   a switching circuit, arranged to selectively couple the output signal to the receiving circuit according to an operation mode of the signal transmitting device;
   wherein the arithmetic circuit receives the received signal and measures the power of the predetermined component by correlating a tone of the predetermined component.

8. The signal transmitting device of claim 7, wherein the received signal is a down-converted baseband signal of the output signal.

9. The signal transmitting device of claim 7, wherein when the signal transmitting device is powered on, the switching circuit couples the output signal to the receiving circuit.

10. The signal transmitting device of claim 1, wherein the signal processing circuit adjusts a complex coefficient of the updated input signal to reduce the power of the predetermined component in the output signal according to the compensating signal.

11. The signal transmitting device of claim 1, wherein the predetermined component comprises a third order in-band component, a third order out-band component, a fifth order in-band component and a fifth order out-band component of the output signal.

12. A signal transmitting method, comprising:
   processing an input signal to generate a processed input signal according to a compensating signal;
   converting the processed input signal to generate an output signal according to an oscillating signal;
   generating the compensating signal according to a power of a predetermined component in the output signal, wherein the compensating signal comprises compensation components corresponding to the predetermined component in the output signal, and the predetermined component comprises a third order in-band component and a third order out-band component of the output signal, or the predetermined component comprises a fifth order in-band component and a fifth order out-band component of the output signal;
   using the compensating signal to add compensation components to the input signal to update the input signal; and
   converting the updated input signal to reduce the power of the predetermined component in the output signal.

13. The signal transmitting method of claim 12, wherein the input signal is a two-tone baseband signal.

14. The signal transmitting method of claim 12, wherein the predetermined component corresponds to a predetermined frequency band in the output signal.

15. The signal transmitting method of claim 12, wherein the step of converting the updated input signal to reduce the power of the predetermined component in the output signal comprises:
   converting the updated input signal to generate an analog input signal;
   performing a low-pass filtering operation upon the analog input signal to generate a filtered input signal;
   modulating the filtered input signal to generate a pre-transmitted output signal according to the oscillating signal; and
   amplifying the pre-transmitted output signal to generate the output signal.

16. The signal transmitting method of claim 15, wherein the updated input signal comprises an in-phase digital signal and a quadrature digital signal, and the step of converting the updated input signal to generate the analog input signal comprises:
   converting the in-phase digital signal into an in-phase analog input signal of the analog input signal; and
   converting the quadrature digital signal into a quadrature analog input signal of the analog input signal;
the step of performing the low-passed filtering operation upon the analog input signal to generate the filtered input signal comprises:
   performing a first low-pass operation upon the in-phase analog input signal to generate a filtered in-phase analog signal; and
   performing a second low-pass operation upon the quadrature analog input signal to generate a filtered quadrature analog signal; and
the step of modulating the filtered input signal to generate the pre-transmitted output signal according to the oscillating signal comprises:
   modulating the filtered in-phase analog signal to generate an in-phase pre-transmitted output signal according to the oscillating signal;
   modulating the filtered quadrature analog signal to generate a quadrature pre-transmitted output signal according to the oscillating signal; and
   combining the in-phase pre-transmitted output signal and the quadrature pre-transmitted output signal to generate the pre-transmitted output.

17. The signal transmitting method of claim 12, further comprising:
   selectively receiving the output signal to generate a received signal according to the oscillating signal according to and an operation mode.

18. The signal transmitting method of claim 12, wherein the step of using the compensating signal to process the input signal to generate the updated input signal comprises:
   adjusting a complex coefficient of the updated input signal to reduce the power of the predetermined component in the output signal according to the compensating signal.

19. The signal transmitting method of claim 12, wherein the predetermined component comprises a third order in-band component, a third order out-band component, a fifth order in-band component and a fifth order out-band component of the output signal.

\* \* \* \* \*